United States Patent [19]
Corsi et al.

[11] Patent Number: 5,825,065
[45] Date of Patent: Oct. 20, 1998

[54] LOW VOLTAGE DMOS TRANSISTOR

[75] Inventors: Marco Corsi, Dallas; Louis N. Hutter, Richardson; John P. Erdeljac, Plano, all of Tex.

[73] Assignee: Texas Instruments Incorporated, Dallas, Tex.

[21] Appl. No.: 782,875

[22] Filed: Jan. 14, 1997

[51] Int. Cl.$^6$ ............................ H01L 29/76; H01L 29/94
[52] U.S. Cl. .................... 257/328; 257/327; 257/335; 257/336; 257/337; 257/338; 257/339
[58] Field of Search .................... 257/327, 328, 257/335, 336, 337, 338, 339

[56] References Cited

U.S. PATENT DOCUMENTS

| | | | |
|---|---|---|---|
| 5,192,989 | 3/1993 | Matsushita et al. | 257/342 |
| 5,386,136 | 1/1995 | Williams et al. | 257/409 |
| 5,654,560 | 8/1997 | Nishizawa et al. | 257/139 |

*Primary Examiner*—Valencia Martin Wallace
*Attorney, Agent, or Firm*—W. James Brady, III; Richard L. Donaldson

[57] ABSTRACT

A method of fabricating a semiconductor device containing a HVDMOS transistor and a LVDMOS transistor and the device which includes providing a region of semiconductor material of a first conductivity type and forming a high voltage DMOS transistor disposed in the region. A relatively low voltage DMOS transistor is also disposed in that region and electrically isolated from the high voltage DMOS transistor. The low voltage DMOS transistor has spaced apart source and drain regions disposed in the region of semiconductor material and a back gate region of the first conductivity type disposed in the region of semiconductor material between the source and drain regions. The back gate region is electrically coupled to the region of semiconductor material. The region of semiconductor material includes a surface, the source, drain and back gate regions extending to that surface. A well of second conductivity type opposite to the first conductivity type is provided in the region of semiconductor material and the high voltage DMOS transistor is disposed in that well. Optionally, one only of the source or drain regions of the low voltage DMOS transistor is disposed in the well. Also, optionally, a region of second conductivity type opposite to the first conductivity type can be provided between the back gate region and the drain region which is less highly doped than the drain region.

10 Claims, 6 Drawing Sheets

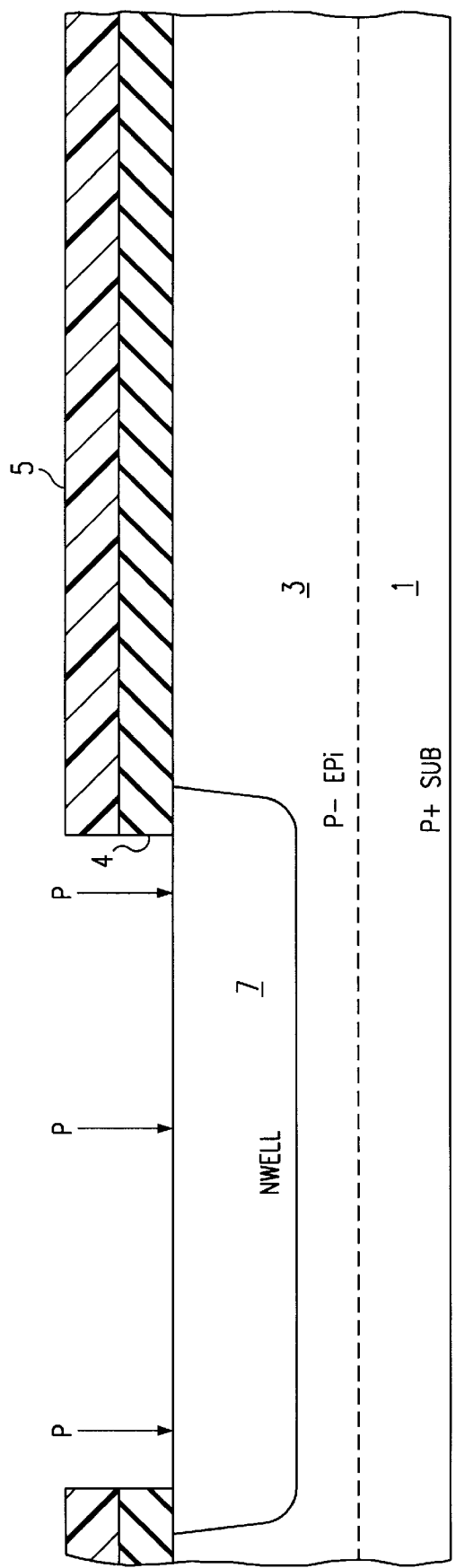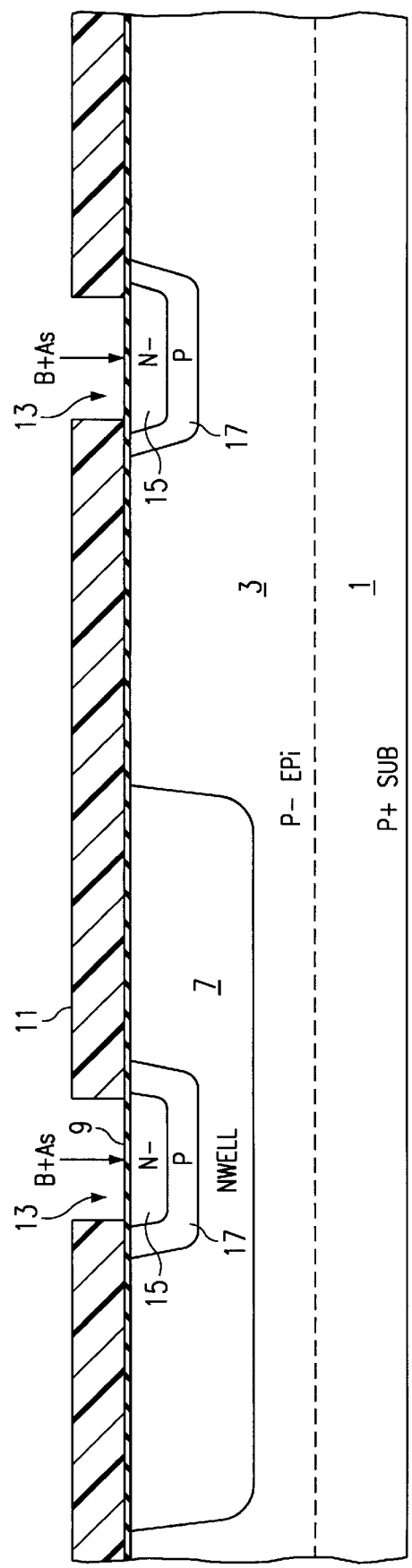
FIG. 1A
FIG. 1B

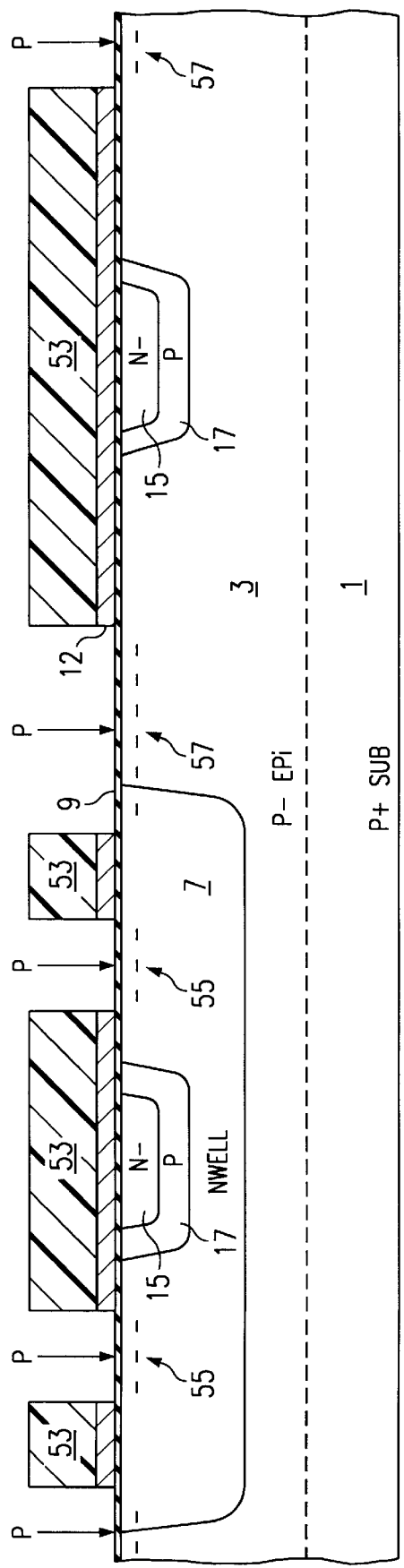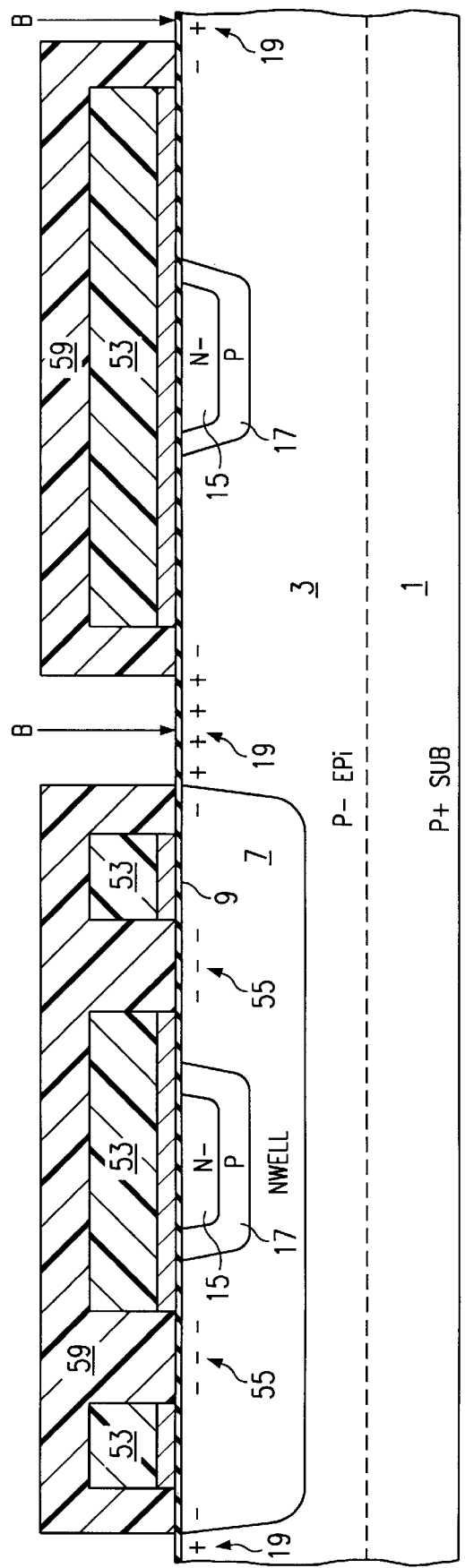
FIG. 1C
FIG. 1D

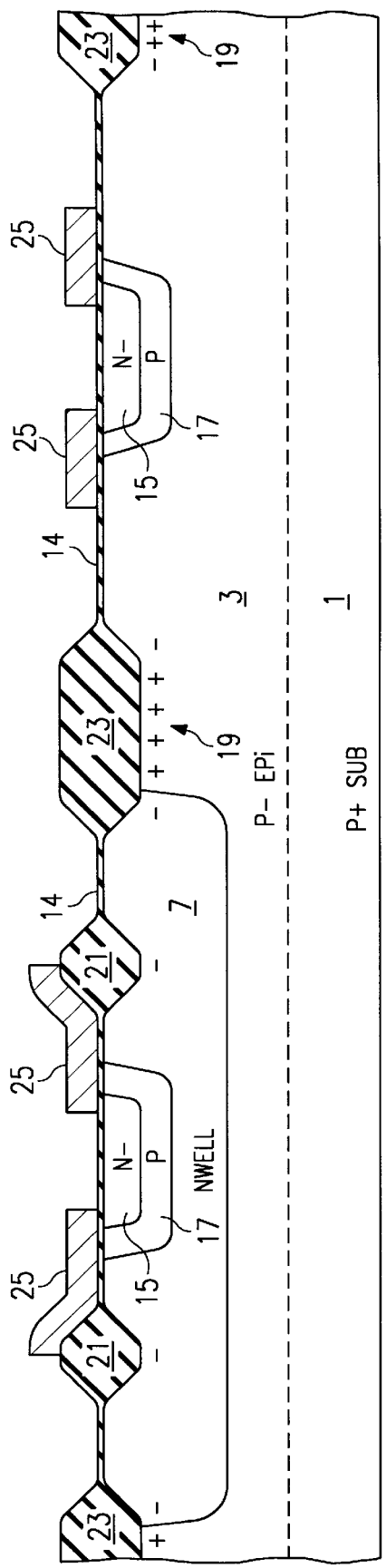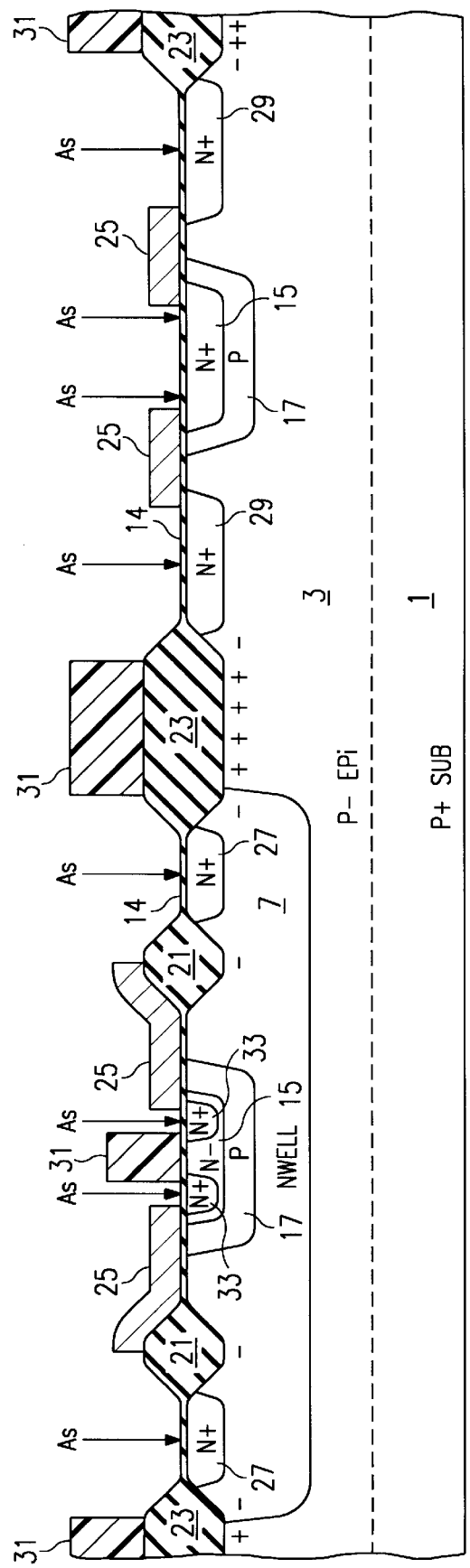

LOW VOLTAGE DMOS TRANSISTOR

BACKGROUND OF THE INVENTION

1. Field Of The Invention

This invention relates to the design and fabrication of DMOS transistors and, more specifically, to such design to eliminate the source/drain diode for low voltage high side bi-directional switching.

2. Brief Description Of The Prior Art

In the prior art, conventional NMOS devices have been used to eliminate the source/drain diode by tying the back gate of the conventional NMOS device to the substrate. Accordingly, special processing is required in the integrated circuit fabrication technology therefor to provide the $V_t$ higher than normal. Additionally, channel lengths of 1 ξm and lower require more expensive processing than is required to build DMOS style devices. The large $V_t$ is required to maintain the leakage current in check in very large devices. With a $V_t$ of 0.7 volt, the subthreshold current is unacceptable on large sub one ohm switches. Another solution to the problem is to have two DMOS devices connected in series. By connecting the two DMOS devices in series, one forward and one backward, bi-directional blocking can be achieved. The arrangement operates well, however it impacts the $R_{dson}$ Area by a factor of four. The $R_{dson}$ Area is a figure of merit for a power switch wherein $R_{dson}$ is the resistance of the FET in question and is multiplied by the area of the FET, usually in cm$^2$. The objective in DMOS devices for power applications is to obtain the lowest on-resistance ($R_{dson}$) in the smallest amount of area. Hence, the value of the product is a technology figure of merit.

SUMMARY OF THE INVENTION

In accordance with the present invention, there is provided a low voltage DMOS (LVDMOS) transistor in combination with a high voltage DMOS (HVDMOS) transistor on a single semiconductor chip and method of fabrication thereof which provides good $R_{dson}$ area of the low LVDMOS transistor and provides high $V_t$ of the LVDMOS transistor and hence the low leakage. An LVDMOS transistor is provided in a DMOS fabrication process with all of its benefits ($V_t$ of 1.5 volts for low leakage and 1.2 μm channel length with low $R_{dson}$ area) in a high side drive application where the LVDMOS transistor is required to block voltage both from drain to source and from source to drain.

Briefly, the above is accomplished by providing a LVDMOS transistor alone or on the same chip wherein the backgate of the LVDMOS transistor is coupled to the substrate. The HVDMOS transistor can also have its backgate coupled to the substrate.

In accordance with a first embodiment of the invention, the HVDMOS transistor is fabricated in an NWELL disposed in a P-type epitaxial layer whereas the back gate of the LVDMOS transistor is coupled to the substrate and isolated from the drain by the epitaxial layer. There is oxide between the gate and source and, therefore, no diode.

In accordance with a second embodiment of the invention, the LVDMOS transistor is altered from that of the first embodiment by providing an additional N-region between the N+ source region and the P-type substrate to increase the breakdown from the N+ drain.

In accordance with a third embodiment of the invention, the LVDMOS transistor is the same as that of the second embodiment except that the polysilicon is terminated on field oxide on the drain side.

It should be understood that, during fabrication, either embodiment of the HVDMOS transistor can be provided in conjunction with any of the embodiments of an LVDMOS transistor. It should also be noted that the LVDMOS transistor can be fabricated apart from the HVDMOS transistor, however, there is an advantage to fabricating the LVDMOS of the present invention and the conventional HVDMOS transistor on the same chip since the process flow for fabrication of the HVDMOS transistor can also be used in conjunction with fabrication of the LVDMOS transistor.

BRIEF DESCRIPTION OF THE DRAWINGS

FIGURES 1a to 1h are a process flow for fabrication of an LVDMOS transistor and an HVDMOS transistor on a single semiconductor chip in accordance with a first embodiment of the present invention;

DESCRIPTION OF THE PREFERRED EMBODIMENT

Figure 1G:
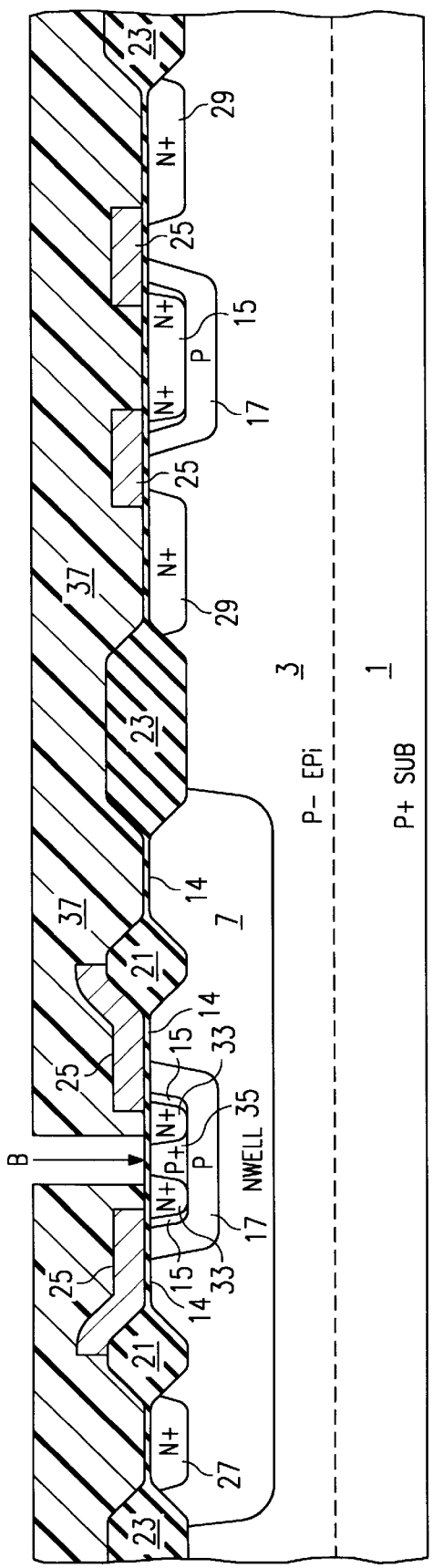

Referring to FIGS. 1a to 1h, there is shown a process flow for fabrication of both a novel LVDMOS transistor and a conventional HVDMOS transistor on the same chip in accordance with the present invention. The fabrication commences, as shown in FIG. 1a with a P+ silicon substrate 1 having a P− silicon epitaxial layer 3 thereon, an oxide layer 4 and a layer of resist 5 resist which is deposited over the oxide layer 4, the oxide layer 4 and resist 5 being patterned and etched to form an opening for formation of the NWELL 7 for the HVDMOS transistor only. Phosphorous, an N-type dopant, is implanted into the exposed portion of layer 3 to form the NWELL 7 therein.

Referring now to FIG. 1b, the oxide 4 and resist 5 are removed and a thin oxide layer 9 is formed over the exposed surface to protect the silicon surface followed by a layer of resist 11 which is patterned to provide an aperture 13 for implant of DWELL dopants. Boron and arsenic are then simultaneously implanted into the aperture 13 over the NWELL 7 and in the aperture 13 where the LVDMOS transistor will be fabricated. Since the boron diffuses into the silicon more rapidly than does the arsenic, a P-type region 17 will be formed below an N-type region 15 at each aperture 13, these regions defining a DWELL as shown in FIG. 1b.

The resist 11 is then removed and channel stops are provided to set the thick field $V_t$ threshold for the process. This is accomplished by using standard LOCOS techniques. This is accomplished by depositing a layer of low-pressure, chemically vapor deposited (LPCVD) nitride 12, forming a patterned resist 53, etching the exposed nitride layer 12 and implanting phosphorous into the exposed regions to provide a negatively doped N-type channel stop region 55 in the NWELL 7 surrounding and spaced from the DWELL therein and a negatively doped N-type channel stop region 57 in the layer 3 which extends into the NWELL and surrounds and is spaced from the DWELL in the layer 3 as shown in FIG. 1c.

A further layer of resist 59 is then added over the resist 53 and patterned to expose the negatively doped N-type channel stop region 57 in the P-type region of layer 3 where the phosphorous had previously been deposited and boron is implanted therein to counterdope the phosphorous and provide a P-type channel stop 19 as shown in FIG. 1d.

The resist layers 53 and 59 are then removed and field oxide (FOX) regions 21 and 23 are then formed in the exposed regions surrounding and spaced from the DWELL of the LVDMOS transistor and the DWELL in the HVDMOS transistor. The nitride layer 12 prevents field oxidation thereunder, thereby maintaining these areas with a thin oxide. After the FOX regions 21 and 23 are grown, the nitride layer 12 is etched off, the oxide 9 is removed by deglaze and new gate oxide 14 is grown with furnace or thermal oxidation. A layer of polysilicon 25 is then deposited, doped with phosphorous by implant or standard furnace doping and patterned to provide source and drain electrodes and define the channel length. As can be seen in FIG. 1e, the field oxide 23 defines the entire moat region or active area for the LVDMOS transistor and extends into the NWELL 7 whereas the field oxide 21 is surrounded by the NWELL and contains the DWELL therein.

Resist 31 is then placed over the structure of FIG. 1e and patterned and arsenic is implanted into the exposed regions to provide an N+ region 27 between the FOX regions 21 and 23 in the NWELL 7 to be used as a back gate contact, an N+ region 29 between FOX region 23 and the polysilicon 25 in the layer 3 surrounding the DWELL therein and an N+ region 33 in the N− region 15 in the NWELL 7. Also, part of the N− region 15 of the DWELL in the layer 3 has been more highly doped to N+ type 33 as shown in FIG. 1f. This forms the N-type source/drain regions for the LVDMOS and the HVDMOS transistors.

Referring now to FIG. 1g, the resist 31 is removed and a new layer of resist 37 is deposited and patterned over the structure of FIG. 1f to expose a portion of N− region 15 of the DWELL in the NWELL 7 within the N+ region 33. Boron is implanted into the exposed region to provide a P+ type region 35 which are source/drain ohmic contacts.

Figure 1H:
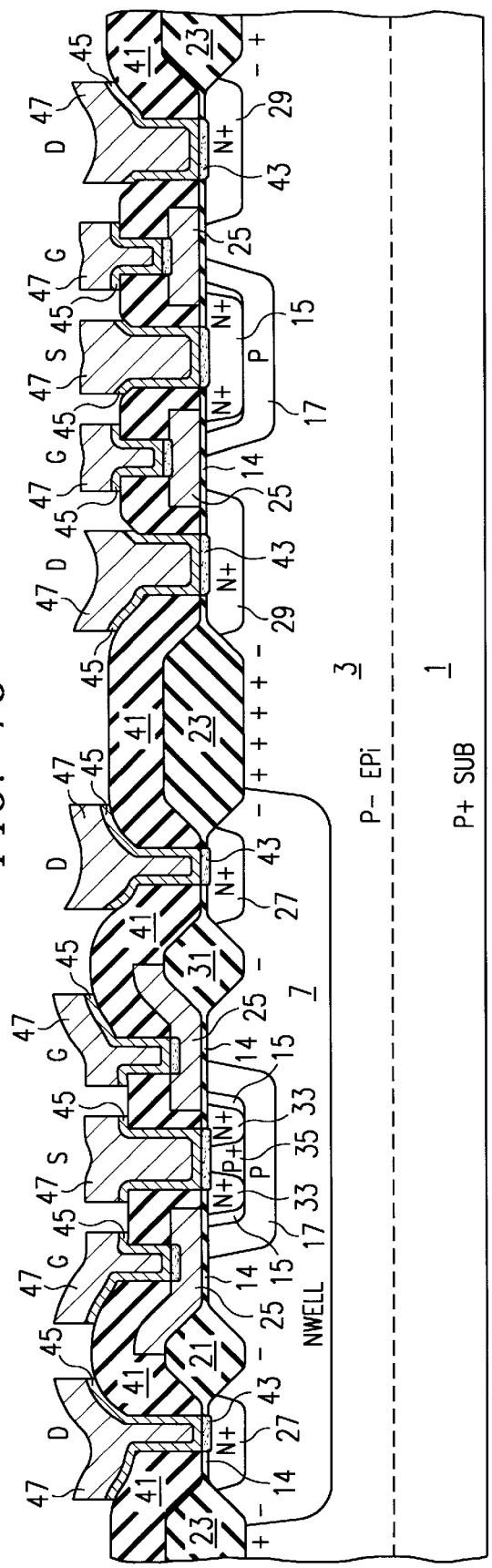

The resist 37 is then removed and a layer of multilevel oxide (MLO) layer 41 is deposited over the surface and patterned and the exposed oxide 14 is removed to expose the N+ region 27, the P+ region 35, the N+ region 29, the N+ region 15 and the polysilicon regions 25. A layer of platinum is deposited and annealed to form platinum silicide (PtSi) 43, after which the unreacted platinum is removed. This is followed by a layer of titanium tungsten (TiW) 45 followed by a layer of aluminum/silicon/copper alloy 47 which are then deposited over the exposed regions to provide contacts to the various regions of the device that is being fabricated as shown in FIG. 1h. An intermediate level oxide (not shown) and second level metallization (not shown) are then added as in the prior art as shown in FIG. 1h in standard manner.

Figure 2A:
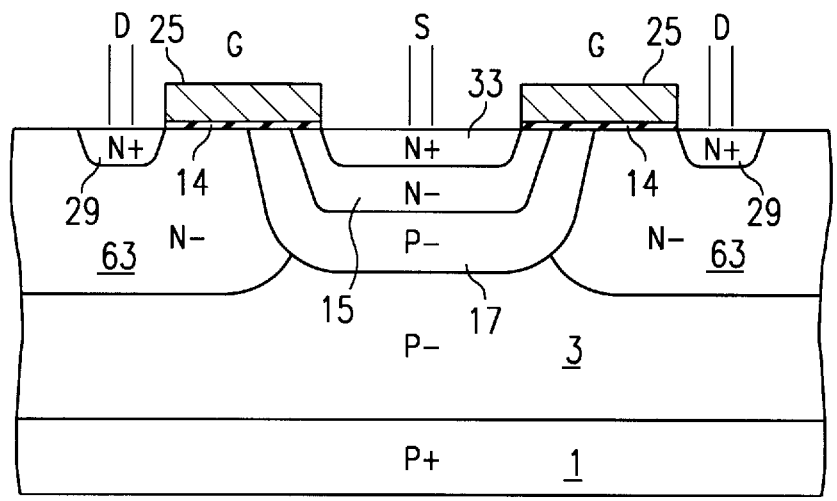
FIG. 2a is a cross sectional view of a second embodiment of an LVDMOS transistor which can be fabricated in accordance with the present invention.

Referring to FIG. 2a, there is shown a second embodiment of the LVDMOS transistor which is the same as that of FIG. 1f except that an NWELL region 63 is disposed in the layer 3 to improve the breakdown voltage between the drain region 29 and the substrate 3 and/or DWELL 17.

Figure 2B:
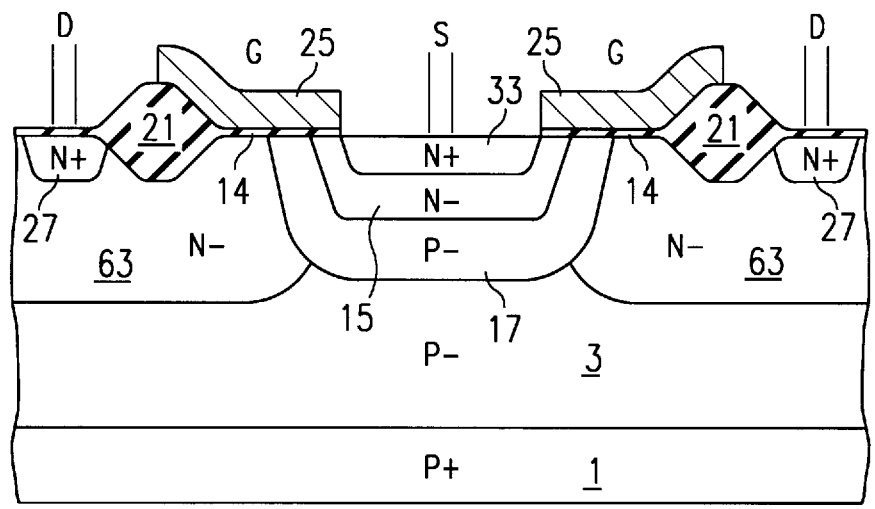
FIG. 2b is a cross sectional view of a third embodiment of an LVDMOS transistor which can be fabricated in accordance with the present invention.

Referring to FIG. 2b, there is shown a third embodiment of the LVDMOS transistor which generally is the same as that of FIG. 2a except that the polysilicon region 25 is terminated on field oxide 21 on the drain 27.

Figure 3:
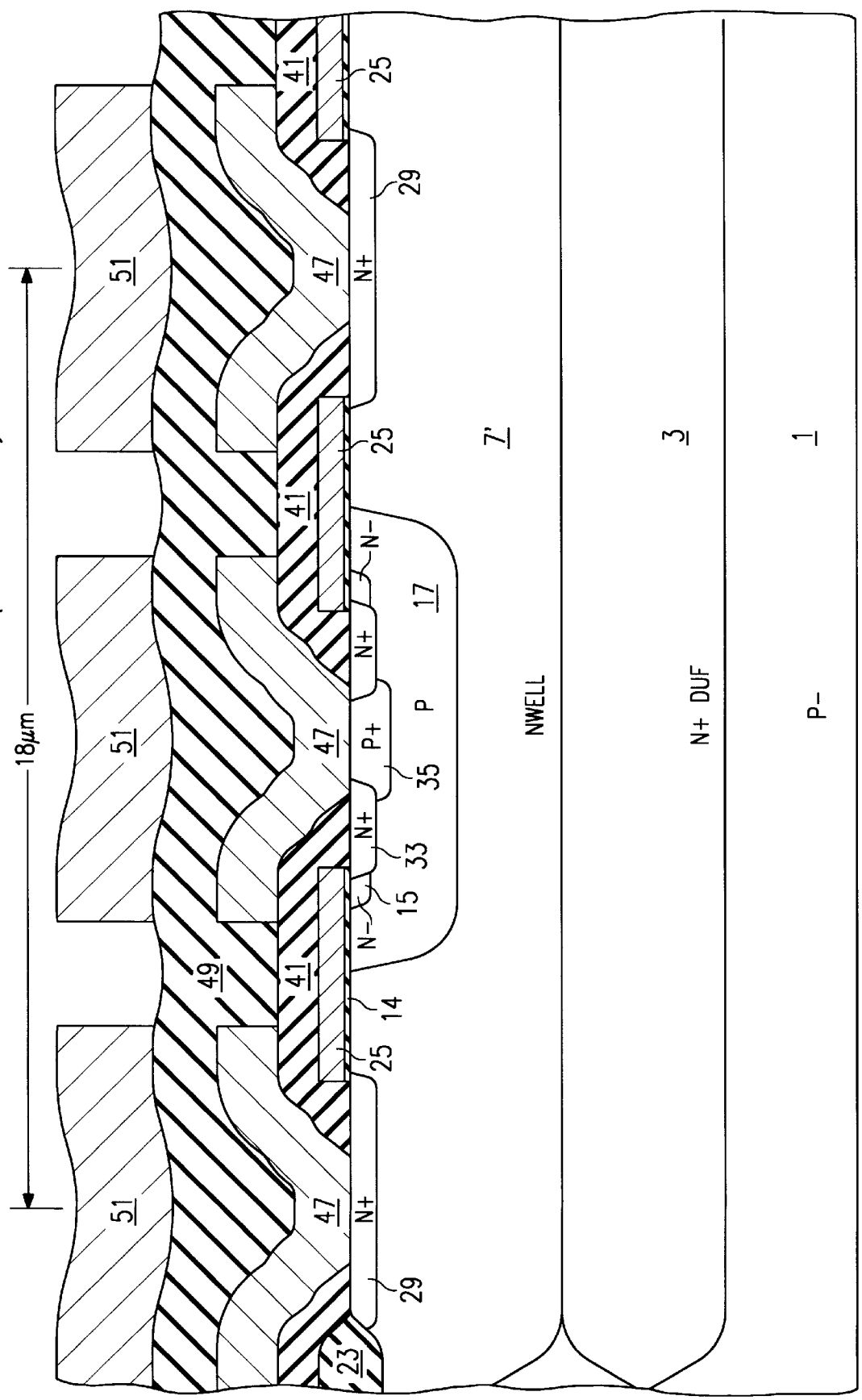
FIG. 3 is a cross sectional view of a prior art LVDMOS transistor on a single semiconductor chip.

Referring now to FIG. 3, there is shown a cross sectional view of a prior art LVDMOS transistor which has been fabricated on a semiconductor chip along with a HVDMOS transistor (not shown) which is the same as the HVDMOS transistor of FIGS. 1a to 1f. The LVDMOS transistor includes a P+ substrate 1 over which is formed a P− epitaxial layer 3. An N-type well (NWELL) 7' is formed in the layer 3 and contains therein N−, N+ and P+ regions which are the same as in the LVDMOS transistor as shown in FIG. 1f. Also shown are the standard intermediate level oxide layer 49 and a second level of metallization 51 which are also present in the embodiment of FIG. 1a to 1f but have been omitted therefrom for clarity.

In comparing the prior art of FIG. 3 with the embodiments of FIG. 1f, 2a or 2b, it can be seen that the back gate region 17 surrounds the N30 region 33 and provides a diode between source and back gate as well as between drain and back gate. This problem is eliminated in accordance with the present invention wherein the back gate region 17 as shown in FIG. 1f, 2a and 2b is coupled to the P+-type substrate 1 via the P-type epitaxial layer 3. The P-type region 17 is spaced from the N+ source/drain regions 15 and 29. The diodes between source/drain are still present. However, since the source is no longer tied to the back gate through a P+ region and the backgate is tied to 0 volts (psub) both the source back gate and drain back gate diodes are reverse biased. Now, as long as both of these diodes are reverse biased, the drain to substrate voltage can be moved positively without large current flow. In addition, no processing steps are added since all of the process steps are present in the fabrication of the HVDMOS transistor in accordance with prior art procedures.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

We claim:

1. A semiconductor device which comprises:
   (a) a region of semiconductor material of a first conductivity type;
   (b) a high voltage DMOS transistor disposed in a well of a second conductivity type opposite to said first conductivity type, said well formed in said region; and
   (c) a relatively low voltage DMOS transistor disposed in said region and electrically isolated from said high voltage DMOS transistor, said low voltage DMOS transistor including:
      (i) spaced apart source and drain regions of said second conductivity type; and
      (ii) a back gate region of said first conductivity type disposed in and contacting said region of semiconductor material, said back gate region surrounding said source region and extending between said source and drain regions, said back gate region being electrically coupled to said region of semiconductor material.

2. The device of claim 1 wherein said region of semiconductor material includes a surface, said source, drain and back gate regions extending to said surface.

3. The device of claim 1 further including a substrate of said first conductivity type, said region of semiconductor material being disposed on said substrate, said substrate being electrically coupled to said gate region.

4. The device of claim 2 further including a substrate of said first conductivity type, said region of semiconductor material being disposed on said substrate, said substrate being electrically coupled to said gate region.

5. The device of claim 1 wherein only one of said source or drain regions of said low voltage DMOS transistor is disposed in said well.

6. The device of claim 2 wherein only one of said source or drain regions of said low voltage DMOS transistor is disposed in said well.

7. The device of claim 4 wherein only one of said source or drain regions of said low voltage DMOS transistor is disposed in said well.

8. The device of claim 1 further including a region of second conductivity type opposite to said first conductivity type disposed between said gate back region and said source region and less highly doped than said source region.

9. A semiconductor device which comprises:
   (a) a region of semiconductor material of a first conductivity type;
   (b) a low voltage DMOS transistor disposed in said region, said low voltage DMOS transistor including:
      (i) spaced apart source and drain regions of a second conductivity type opposite said first conductivity type; and
      (ii) a back gate region of said first conductivity type disposed in and contacting said region of semiconductor material, said back gate region surrounding said source region and extending between said source and drain regions, said back gate region being electrically coupled to said region of semiconductor material;

wherein said region of semiconductor material includes a surface, said source, drain and back gate regions extending to said surface and said region of semiconductor material includes a well of second conductivity type opposite to said first conductivity type, said drain region being disposed in said well.

10. The device of claim 9 further including a substrate of said first conductivity type, said region of semiconductor material being disposed on said substrate, said substrate being electrically coupled to said gate region.

* * * * *